(12) United States Patent
Ma

(10) Patent No.: US 7,298,010 B1
(45) Date of Patent: Nov. 20, 2007

(54) RADIATION-HARDENED TRANSISTOR AND INTEGRATED CIRCUIT

(75) Inventor: Kwok K. Ma, Albuquerque, NM (US)

(73) Assignee: Sandia Corporation, Albuquerque, NM (US)

(*) Notice: Subject to any disclaimer, the term of this patent is extended or adjusted under 35 U.S.C. 154(b) by 0 days.

(21) Appl. No.: 11/358,391

(22) Filed: Feb. 21, 2006

(51) Int. Cl.
    *H01L 23/62* (2006.01)
(52) U.S. Cl. ............ 257/359; 257/358; 257/357; 257/369; 257/371; 327/112; 327/537; 327/108
(58) Field of Classification Search ........... 257/369, 257/347, 349, 358, 357, 371, 401, 414, 500; 438/197, 332; 327/112, 537, 108; 326/83
See application file for complete search history.

(56) References Cited

U.S. PATENT DOCUMENTS

| | | | |
|---|---|---|---|
| 3,776,786 A * | 12/1973 | Dunkley et al. ............ 438/332 |
| 5,175,605 A | 12/1992 | Pavlu et al. |
| 5,406,513 A | 4/1995 | Canaris et al. |
| 5,644,155 A * | 7/1997 | Lien ............................ 257/401 |
| 5,773,328 A * | 6/1998 | Blanchard ................... 438/162 |
| 6,268,630 B1 * | 7/2001 | Schwank et al. ........... 257/347 |
| 6,275,080 B1 | 8/2001 | Phan et al. |
| 6,278,287 B1 | 8/2001 | Baze |
| 6,549,443 B1 | 4/2003 | Jensen et al. |
| 6,794,908 B2 * | 9/2004 | Erstad ......................... 327/112 |
| 7,046,039 B1 * | 5/2006 | Early et al. .................. 326/83 |
| 2002/0109535 A1 * | 8/2002 | Caliboso ...................... 327/143 |
| 2002/0171104 A1 * | 11/2002 | Cable et al. ................. 257/347 |
| 2004/0007743 A1 | 1/2004 | Matsuda et al. |
| 2004/0207031 A1 * | 10/2004 | Berndt et al. ............... 257/414 |
| 2004/0256692 A1 * | 12/2004 | Kunz et al. .................. 257/500 |
| 2005/0179093 A1 | 8/2005 | Morris |

OTHER PUBLICATIONS

Neumeier and Bruemmer, IEEE transactions on Nuclear Science, vol. 41, No. 3, Jun. 1994.*
Steven H. Voldman, "MeV Implants Boost Device Design" IEE Circuits and Devices Magazine, vol. 11, Nov. 1995, pp. 8-16.
T. Calin et al, "Upset Hardened Memory Design for Submicron CMOS Technology", IEEE Transactions on Nuclear Science, vol. 43, No. 6, Dec. 1996, pp. 2874-2878.

(Continued)

*Primary Examiner*—Jerome Jackson
*Assistant Examiner*—Jami M Valentine
(74) *Attorney, Agent, or Firm*—John P. Hohimer

(57) ABSTRACT

A composite transistor is disclosed for use in radiation hardening a CMOS IC formed on an SOI or bulk semiconductor substrate. The composite transistor has a circuit transistor and a blocking transistor connected in series with a common gate connection. A body terminal of the blocking transistor is connected only to a source terminal thereof, and to no other connection point. The blocking transistor acts to prevent a single-event transient (SET) occurring in the circuit transistor from being coupled outside the composite transistor. Similarly, when a SET occurs in the blocking transistor, the circuit transistor prevents the SET from being coupled outside the composite transistor. N-type and P-type composite transistors can be used for each and every transistor in the CMOS IC to radiation harden the IC, and can be used to form inverters and transmission gates which are the building blocks of CMOS ICs.

15 Claims, 10 Drawing Sheets

OTHER PUBLICATIONS

J. R. Schwank et al, "BUSFET—A Radiation-Hardened SOI Transistor," IEEE Transactions on Nuclear Science, vol. 46, No. 6, Dec. 1999 pp. 1809-1816.

Mark P. Baze, et al, "A Digital CMOS Design Technique for SEU Hardening," IEEE Transactions on Nuclear Science, vol. 47, No. 6, Dec. 2000 pp. 2603-2608.

David G. Mavis et al, "Soft Error Rate Mitigation Techniques for Modern Microcircuits," IEEE 02CH37320. 40th Annual International Reliability Physics Symposium, Dallas, Texas, 2002, pp. 216-225.

Wesley Morris, "Latchup in CMOS," IEEE 03CH37400. 41st Annual International Reliability Physics Symposium, Dallas, Texas, 2003 pp. 76-84.

Paul E. Dodd et al, "Production and Propagation of Single-Event Transients in High-Speed Digital Logic ICs," IEEE Transactions on Nuclear Science vol. 51, No. 6, Dec. 2004 pp. 3278-3284.

A. Makihara et al, "SEE in a 0.15 μm Fully Depleted CMOS/SOI Commercial Process," IEEE Transactions on Nuclear Science, vol. 51, No. 6, Dec. 2004, pp. 3621-3625.

* cited by examiner

US 7,298,010 B1

RADIATION-HARDENED TRANSISTOR AND INTEGRATED CIRCUIT

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to radiation hardening of integrated circuits (ICs), and more particularly to a radiation-hardened composite transistor which can be used to radiation harden complementary metal-oxide semiconductor (CMOS) integrated circuits (ICs) to suppress single-event transients.

BACKGROUND OF THE INVENTION

Radiation hardening of ICs against single-event transients is becoming increasingly important as device sizes become smaller and smaller, and as clock speeds become faster and faster. A single-event transient (SET) is a disturbance in an IC produced by an energetic particle (e.g. an ion, proton, neutron) impinging on a sensitive node in the IC and depositing sufficient charge to create a transient signal therein. The sensitive nodes of a CMOS circuit are the drain-body reverse-biased junctions of the "OFF" transistors. When an energetic particle impinges on the drain-body reverse-biased junction in an "OFF" transistor, it generates electrons and holes which are collected by the junction. This can produce a transient signal which can temporarily switch the "OFF" transistor to an "ON" state. As a result, the transient signal can change the state of a flip-flop, latch or memory cell formed by that transistor, thereby creating erroneous data in the IC and producing a single-event upset (SEU). The transient signal can also be propagated in the IC to affect the state of other logic elements therein.

A number of schemes have been proposed and implemented to mitigate the effects of SETs and SEUs in digital circuits. These schemes are briefly discussed below.

Spatial redundancy utilizes additional circuits to detect and/or correct SEU errors caused by SETs. This scheme, which includes the use of replicated storage cells and voting schemes, can require a significant increase in circuit complexity.

Temporal redundancy is based on sampling an input multiple times before it is stored in a register. If the duration of a signal is less than a predetermined pulse width, the signal is assumed to be a SET or noise, and is ignored by the register. This scheme has been effective for hardening against SETs which are generated external to the register, but can be ineffective for a SET produced inside the register. Additionally, as CMOS devices become smaller and faster, they become more sensitive to SETs with the SETs having a pulse width comparable to the pulse width of the logic signals propagating in the IC. As a result, this scheme is expected to become less effective for smaller and faster transistors, or else the operating frequency of the ICs will need to be limited to allow effective filtering of the SET signal.

Filtering is based on the use of feedback circuits which are added to registers to slow down their response time. As a result the registers do not respond to signals, external or internal, faster than a predetermined response time. This scheme imposes a space penalty due to the substrate space required for the feedback circuits; and it also imposes a speed penalty due to the response time set by the feedback circuits.

SET reduction schemes are based on the use of processing techniques to reduce charge generation and collection in semiconductor material produced by energetic particle strikes. For example, silicon-on-insulator (SOI) CMOS transistors have a much smaller cross section compared with bulk CMOS transistors and thus are less sensitive to SETs. High-energy, high-dose implants can also be used for CMOS transistors to reduce the charge collection from an energetic particle strike. The use of SET reduction schemes can be difficult to implement for ICs fabricated in a foundry since it requires that the foundry's processing techniques must be changed.

SET suppression schemes eliminate transient signal propagation when a SET occurs instead of mitigating the effects of the SET. SET suppression schemes have been disclosed, for example, in U.S. Pat. Nos. 5,175,605; 6,278,287; 6,794,908; and in U.S. Patent Application Publication No. 2004/0007743. The SET suppression schemes known heretofore are less than satisfactory due to a number of factors including the existence of alternate current paths that can allow propagation of SETs around a protected transistor, the existence of certain elements of a circuit (e.g. transmission gates) which remain unprotected against SETs, the inapplicability of these SET suppression schemes to circuits formed with bulk CMOS transistors, and the inapplicability of these SET suppression schemes to circuits formed with body-tied SOI transistors.

The present invention provides a radiation-hardened composite transistor which overcomes the limitations of the prior art.

The radiation-hardened composite transistor of the present invention can be substituted for each and every transistor in a conventional CMOS IC to produce a radiation-hardened IC.

The radiation-hardened composite transistor of the present invention is applicable to any and all types of CMOS ICs and circuits therein including transmission gates.

The present invention is applicable to both CMOS circuits formed using bulk silicon transistors, and to circuits formed using body-tied SOI transistors.

These and other advantages of the present invention will become evident to those skilled in the art.

SUMMARY OF THE INVENTION

The present invention relates to a composite transistor for use in radiation hardening a complementary metal-oxide semiconductor (CMOS) integrated circuit (IC). The composite transistor comprises a circuit transistor of an n-type or p-type having a source terminal, a drain terminal, a gate terminal and a body terminal; and a blocking transistor of the same n-type or p-type also having a source terminal, a drain terminal, a gate terminal and a body terminal. The gate terminals of the circuit and blocking transistors are connected together to form a gate terminal for the composite transistor. The source terminal of the circuit transistor forms a source terminal for the composite transistor; and the drain terminal of the blocking transistor forms a drain terminal for the composite transistor. The source terminal of the blocking transistor is connected to the drain terminal of the circuit transistor. The body terminal of the circuit transistor forms a body terminal for the composite transistor. The body terminal of the blocking transistor is connected to the source terminal of the blocking transistor and is electrically isolated from any other connection point (i.e. node) in the CMOS IC.

The composite transistor can further include a silicon-on-insulator (SOI) substrate wherein the circuit and blocking transistors are formed, with the SOI substrate having a buried oxide layer sandwiched between a monocrystalline silicon body and a monocrystalline silicon layer. In some embodiments of the present invention, the circuit transistor and the blocking can be formed within a common island defined within the monocrystalline silicon layer with the island being surrounded by a field oxide for electrical isolation. The bodies of the circuit and blocking transistors can be separated and electrically isolated from each other by a common drain/source region which forms a drain for the circuit transistor and a source for the blocking transistor. In other embodiments of the present invention, the circuit transistor and blocking transistor can be formed in separate islands defined within the monocrystalline silicon layer, with each island being surrounded by a field oxide for electrical isolation.

In yet other embodiments of the present invention, the composite transistor can further include a bulk semiconductor substrate (e.g. a silicon substrate) wherein the circuit transistor and the blocking transistor are formed. The bulk semiconductor substrate can comprise a p-type-doped substrate having a separate n-type-doped well wherein each p-type composite transistor is formed, and further having a separate p-type-doped well wherein each n-type composite transistor is formed, with each p-type doped well being located within another n-type-doped well to electrically isolate each p-type-doped well from the p-type-doped substrate. Alternately, the bulk semiconductor substrate can comprise an n-type-doped substrate having a separate p-type-doped well wherein each n-type composite transistor is formed, and further having a separate n-type-doped well wherein each p-type composite transistor is formed, with each n-type-doped well being located within another p-type-doped well to electrically isolate each n-type-doped well from the n-type-doped substrate.

The present invention also relates to a radiation-hardened CMOS IC which comprises a semiconductor substrate; and a plurality of interconnected n-type and p-type composite transistors formed on the semiconductor substrate. Each n-type and p-type composite transistor further comprises a circuit transistor and a blocking transistor of the same n-type or p-type, with the circuit and blocking transistor each having a source terminal, a drain terminal, a gate terminal, and a body terminal. The gate terminals of the circuit and blocking transistors are connected together to form a gate terminal for the composite transistor. The source terminal of the circuit transistor forms a source terminal for the composite transistor; and the drain terminal of the blocking transistor forms a drain terminal for the composite transistor. The source terminal of the blocking transistor is connected to the drain terminal of the circuit transistor. The body terminal of the circuit transistor forms a body terminal for the composite transistor. The body terminal of the blocking transistor is connected to the source terminal of the blocking transistor and is electrically isolated from any other connection point in the CMOS IC.

The semiconductor substrate can comprise a SOI substrate, or a bulk silicon substrate. When a bulk silicon substrate is used, a body of each blocking transistor forms a part of a reverse-biased semiconductor p-n junction to electrically isolate the body of that blocking transistor from the bulk silicon substrate, and from every other circuit transistor and blocking transistor in the radiation-hardened CMOS IC.

The present invention further relates to a radiation-hardened CMOS IC which comprises a first p-channel transistor having a source terminal, a drain terminal, a gate terminal and a body terminal, with the body terminal of the first p-channel transistor being connected to the source terminal thereof; a second p-channel transistor having a source terminal, a drain terminal, a gate terminal and a body terminal, with the gate terminal of the second p-channel transistor being connected to the gate terminal of the first p-channel transistor, and with the source and body terminals of the second p-channel transistor being connected together and further being connected only to the drain terminal of the first p-channel transistor and to no other node in the radiation-hardened CMOS IC; a third n-channel transistor having a source terminal, a drain terminal, a gate terminal and a body terminal, with the body terminal of the third n-channel transistor being connected to the source terminal thereof; and a fourth n-channel transistor having a source terminal, a drain terminal, a gate terminal and a body terminal, with the gate terminal of the fourth n-channel transistor being connected to the gate terminal of the third n-channel transistor, and with the source and body terminals of the fourth n-channel transistor being connected together and further being connected only to the drain terminal of the third n-channel transistor and to no other node in the radiation-hardened CMOS IC.

The source terminal of the first p-channel transistor can be connected to a first reference potential (e.g. $V_{dd}$), and the source terminal of the third n-channel transistor can connected to a second reference potential (e.g. $V_{ss}$). The gates of the first and second p-channel transistors can be connected to the gates of the third and fourth n-channel transistors to provide an input connection for the radiation-hardened CMOS IC. The drain terminals of the second p-channel transistor and the fourth n-channel transistor can be connected together to provide an output connection for the radiation-hardened CMOS IC. This connection arrangement produces an inverter.

Alternately, the source terminal of the first p-channel transistor can be connected to the source terminal of the third n-channel transistor to provide an input connection for the radiation-hardened CMOS IC; and the drain terminal of the second p-channel transistor can be connected to the drain terminal of the fourth n-channel transistor to provide an output connection for the radiation-hardened CMOS IC. This connection arrangement can produce a body-tied one-way transmission gate, or alternately a two-way transmission gate when the bodies of the transistors are not tied. A body-tied two-way transmission gate can also be formed by oppositely connecting two one-way transmission gates as will be described in detail hereinafter.

The present invention also relates to a radiation-hardened CMOS IC which comprises a semiconductor substrate; a plurality of interconnected n-type and p-type metal-oxide semiconductor (MOS) transistors on the semiconductor substrate, with every n-type and p-type MOS transistor in the radiation-hardened CMOS integrated circuit being a composite transistor which further comprises a circuit transistor of an n-type or p-type having a source terminal, a drain terminal, and a gate terminal; and a blocking transistor of the same n-type or p-type having a source terminal, a drain terminal and a gate terminal, with the gate terminals of the circuit and blocking transistors being connected together to form a gate terminal for the composite transistor, with the source terminal of the circuit transistor forming a source terminal for the composite transistor, with the drain terminal of the blocking transistor forming a drain terminal for the composite transistor, and with the source terminal of the blocking transistor being connected to the drain terminal of the circuit transistor.

Each circuit transistor can further comprise a body terminal that forms a body terminal for the composite transistor; and each blocking transistor can further comprise another body terminal which is connected only to the source terminal of the blocking transistor, and to no other node in the CMOS IC. The substrate can comprise a silicon-on-insulator substrate, or a bulk silicon substrate.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
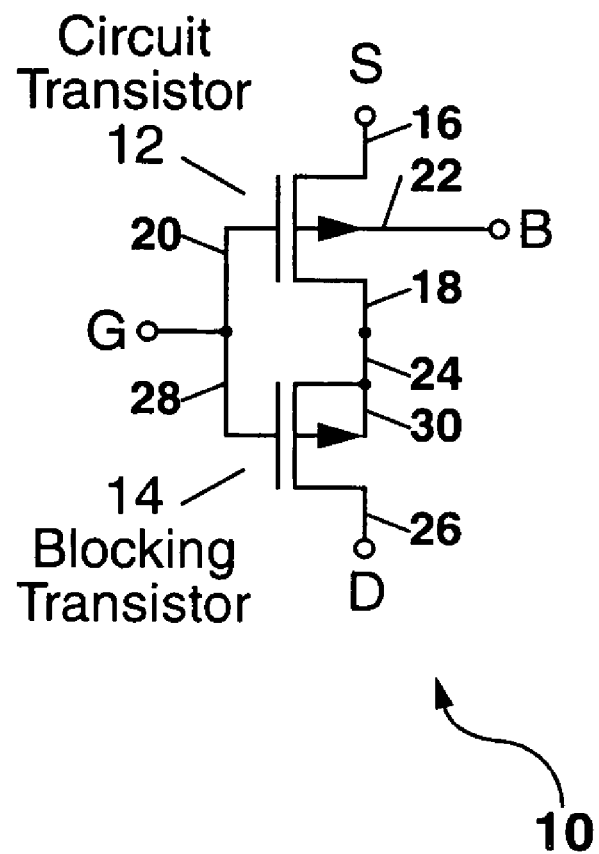
FIG. 1 shows a schematic diagram of a p-type composite transistor of the present invention which can be used to form a radiation-hardened integrated circuit.

Referring to FIG. 1, there is shown a schematic diagram of a radiation-hardened composite transistor 10 of the present invention which can be used to form a radiation-hardened complementary metal-oxide semiconductor (CMOS) integrated circuit (IC). The composite transistor 10 comprises a circuit transistor 12 and a blocking transistor 14 connected together as shown. Each circuit transistor 12 and blocking transistor 14 can be a metal-oxide semiconductor (MOS) transistor. The term "MOS transistor" as used herein is intended to include transistors having gates formed of a metal, a metal alloy, or polycrystalline silicon (also termed polysilicon).

In the example of FIG. 1, the circuit transistor 12 further comprises a source terminal 16, a drain terminal 18, a gate terminal 20 and a body terminal 22. The blocking transistor comprises another source terminal 24, another drain terminal 26, another gate terminal 28 and another body terminal 30. The gate terminals 20 and 28 are connected together as shown in FIG. 1 to form a gate terminal G for the composite transistor 10. The source terminal 16 forms a source terminal S for the composite transistor 10; and the drain terminal 26 forms a drain terminal D for the composite transistor 10. The body terminal 22 of the circuit transistor 12 also forms a body terminal B for the composite transistor 10. The body terminal 30 of the blocking transistor 14 is connected to the source terminal 24 thereof and is electrically isolated from any other connection point (also termed a node) in a CMOS IC wherein the transistor is used. According to the present invention, the body terminal 30 of the blocking transistor 14 is never connected to the body terminal 22 of the circuit transistor 12 through a direct or resistive interconnection, or to any other resistor, capacitor or transistor in the CMOS IC since this would provide a current path for a transient current to flow around the blocking transistor 14.

Figure 2:
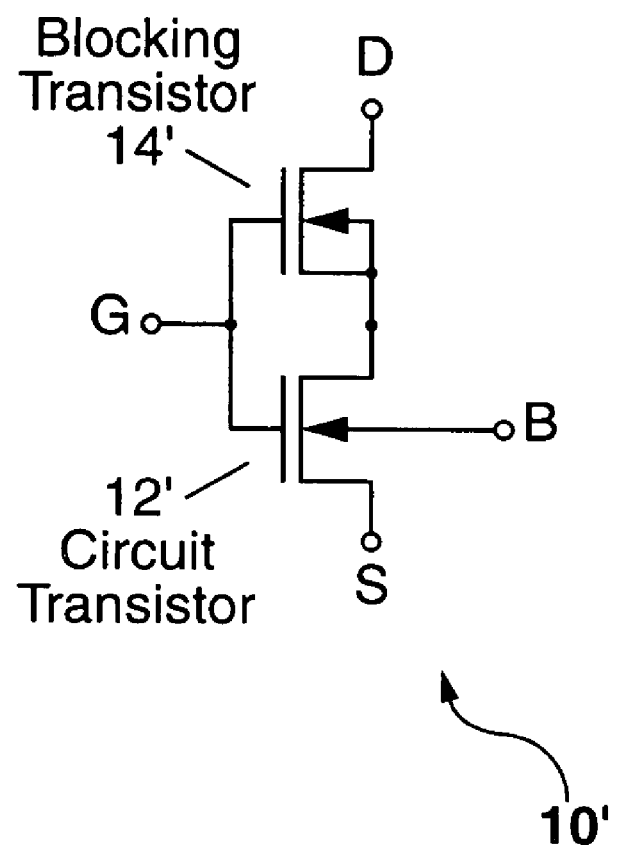
FIG. 2 shows a schematic diagram of an n-type composite transistor according to the present invention.

Although FIG. 1 shows a p-type circuit transistor 12 and a p-type blocking transistor 14 to form a p-type composite transistor 10, a similar circuit arrangement can be used to form an n-type composite transistor 10' as shown in FIG. 2 using an n-type circuit transistor 12' and an n-type blocking transistor 14'. In the p-type and n-type composite transistors, 10 and 10', of FIGS. 1 and 2, the body terminal B of the composite transistors can be tied to the source S thereof, or to a reference potential (e.g. $V_{dd}$ or $V_{ss}$). In other embodiments of the present invention, the body terminal B can be omitted from each transistor 10 and 10'.

The p-type and n-type composite transistors 10 and 10', respectively, are useful for radiation hardening CMOS ICs to mitigate against single-event transients (SETs). To radiation-harden any type of CMOS IC against SETs according to the present invention, each and every transistor in the IC will preferably be replaced by the composite transistors 10 and 10' of the present invention. When the CMOS IC to be radiation-hardened contains a transmission gate, a one-way or two-way transmission gate as described hereinafter can be substituted for the transmission gate in the CMOS IC. If this is done, then any SET that is produced within the circuit transistor or blocking transistor of one of the composite transistors 10 or 10' in the CMOS IC will be blocked from propagating to the output of that composite transistor 10 or 10' so that the CMOS IC will be unaffected by SETs.

Figure 3:
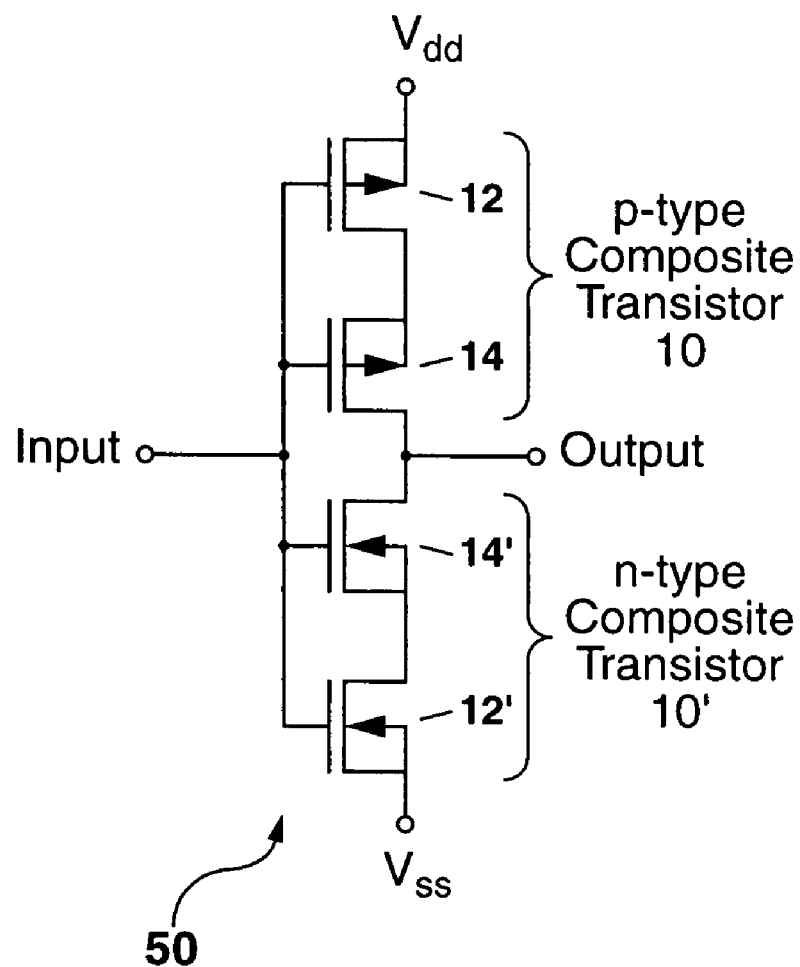
FIG. 3 shows a schematic diagram of an example of an inverter circuit formed using the p-type and n-type composite transistors of FIGS. 1 and 2.
Figure 4A:
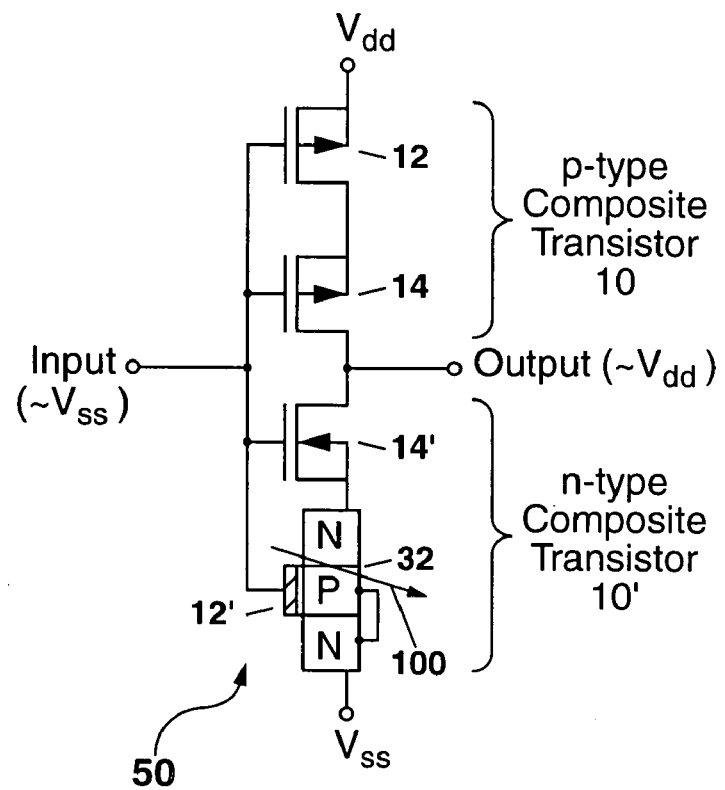
FIG. 4A shows a schematic diagram of the inverter circuit of FIG. 3 with the circuit symbol for the n-type circuit transistor being replaced by a schematic cross-section view of this transistor to show the location of a drain-source junction and an energetic particle impacting this junction to produce a single-event transient when the transistor is in an "OFF" state.
Figure 4B:
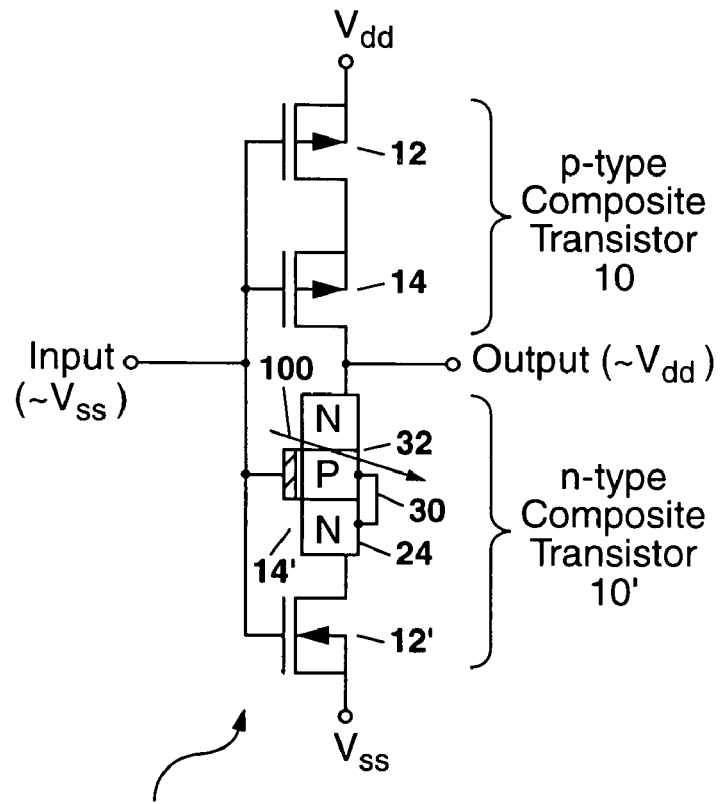
FIG. 4B shows a schematic diagram of the inverter circuit of FIG. 3 with the circuit symbol for the n-type blocking transistor being replaced by a schematic cross-section view of this transistor to show an energetic particle impinging on a drain-source junction in this transistor to produce a single-event transient therein when the transistor is in the "OFF" state.

This can be understood by analyzing the performance of an inverter circuit 50 formed from a p-channel (i.e. p-type) composite transistor 10 and an n-channel (i.e. n-type) composite transistor 10' as shown in FIGS. 3 and 4A, 4B. FIG. 3 shows a schematic diagram of the inverter 50; and FIGS. 4A, 4B show schematic cross-section views of the circuit transistor 12' and the blocking transistor 14' to show the location of a drain-body junction 32 which is sensitive to an impinging energetic particle 100 when the transistors 12' and 14' are in an "OFF" state for which the drain-body junction 32 is reverse-biased. The drain-body junction 32 in each transistor 12' and 14' is located at the interface between an N+ doped drain and a P doped body of these transistors 12' and 14'. In FIGS. 4A and 4B, the impinging energetic particle 100 is shown as an arrow which shows the path of the energetic particle 100.

In FIG. 4A, the energetic particle 100 (e.g. an ion, proton or neutron) is shown impinging on the drain-body junction 32 of the n-type circuit transistor 12' when the input of the inverter 50 is "LOW" (i.e. approximately equal to $V_{SS}$). With a "LOW" input, the n-type composite transistor 10' is turned "OFF" and the p-type composite transistor 10 is turned "ON" to provide a "HIGH" state for the output of the inverter 50. In this state of the inverter 50, the energetic particle 100 impinging on the reverse-biased drain-body junction 32 of the n-type circuit transistor 12' will produce charges (i.e. electrons and holes) on either side of the junction 32 that result in a transient voltage source $V_{SET}$ being formed across the junction 32.

In a conventional inverter having only a single n-type transistor and a single p-type transistor connected in series, the transient voltage $V_{SET}$ produced by an impinging energetic particle 100 could result in a relatively large transient current $I_{SET}$ that can temporarily pull down the "HIGH" output of the inverter to the "LOW" state, thereby producing a single-event transient (SET) which can be propagated to other circuits to which the inverter output is connected, thereby producing a single-event upset (SEU).

In the present invention, however, the blocking transistor 14' in FIG. 4A will effectively suppress the transient current $I_{SET}$ since the blocking transistor 14' will be turned "OFF" by the "LOW" input of the inverter 50. In the "OFF" state, the blocking transistor 14' in FIG. 4A provides a very high source impedance (e.g. >100 MΩ) in series with the transient voltage $V_{SET}$ as compared with a very low $V_{dd}$ source impedance of transistors 12 and 14 which are turned "ON" by the "LOW" input of the inverter 50. The very high source impedance of the "OFF" blocking transistor 14' in FIG. 4A will reduce the transient current $I_{SET}$ to a very small value of approximately zero (i.e. $I_{SET}$~0). As a result, the small value of the transient current $I_{SET}$ will be unable to pull down the "HIGH" output of the inverter 50 so that the inverter output will remain "HIGH" with a value approximately equal to $V_{dd}$ as determined by the transistors 12 and 14 which are both turned "ON". Thus, although the SET occurs in the circuit transistor 12' in FIG. 4A, the SET will be prevented from reaching the output of the inverter 50 due to the blocking transistor 14'. Eventually, the charges produced by the SET will recombine within the circuit transistor 12'. The output of the inverter 50 and any other circuit connected thereto will thus be unaffected by the SET, thereby contributing to the radiation hardening of the inverter 50 against SETs.

FIG. 4B schematically illustrates the situation when the energetic particle 100 impinges on the drain-body junction of the blocking transistor 14' which is in the "OFF" state when the input of the inverter 50 is "LOW" (i.e. ~$V_{ss}$). In this case, the charge produced by the energetic particle 100 similarly produces a transient voltage source $V_{SET}$ across the reverse-biased drain-body junction 32 of the blocking transistor 14' in FIG. 4B. Since the circuit transistor 12' in FIG. 4B is also in the "OFF" state, the circuit transistor 12' will provide a very high source impedance (e.g. >100 MΩ) compared to the "ON" transistors 12 and 14; and this will again reduce the transient current $I_{SET}$ to a very small value $I_{SET}$~0. Again, since transient current $I_{SET}$ is nearly zero, it will be unable to affect the output of the inverter 50 which will remain "HIGH". There is no alternative low-impedance path to $V_{ss}$ for the transient current $I_{SET}$ to flow since the body terminal 30 of the blocking transistor 14' is only connected to its source 24. Eventually, the electrons and holes produced by the energetic particle will recombine within the blocking transistor 14'.

In both cases above, there is no current path around the circuit transistor/blocking transistor pair that would allow the inverter output to be perturbed from its expected "HIGH" state. Note that in FIGS. 4A and 4B, the body (labelled "P") of the blocking transistor 14' is tied only to the source (labelled "N") of the blocking transistor 14' and not to any other node in the inverter 50 or to any voltage reference (e.g. $V_{ss}$) or to any node in any other circuit that would provide a low-impedance current path so that a substantial transient current could reach the output of the inverter 50 to perturb its state.

When the input to the inverter is "HIGH" (i.e. approximately equal to $V_{dd}$) and the p-type circuit and blocking transistors, 12 and 14, are turned "OFF", then the effect of a SET on these transistors must be considered. In this case, which is similar to that depicted in FIGS. 4A and 4B, when either one of the circuit and blocking transistors, 12 and 14, experience a SET due to an incident energetic particle 100, the other transistor 14 or 12 in the p-type composite transistor 10 provides a very high source impedance in the "OFF" state which will limit the transient current $I_{SET}$ to being near zero. This very small value of the transient current $I_{SET}$~0 will not alter the "LOW" output of the inverter 50 which is set by the n-type circuit and blocking transistors 12' and 14' being switched "ON". As a result, the effect of the SET will be mitigated; and the output of the inverter 50 will remain unchanged in the "LOW" state with a voltage of about $V_{ss}$.

The p-type and n-type composite transistors 10 and 10' of the present invention can be used to form any type of CMOS IC known to the art. This can be done simply by substituting a composite transistor 10 or 10' for each transistor of the same type in a conventional CMOS IC. This will be advantageous since then each and every transistor within the resulting CMOS IC will be protected against SETs. This is also advantageous over other known schemes which try to mitigate against SETs since these other schemes leave certain types of circuits such as transmission gates unprotected against SETs.

Figure 5A:
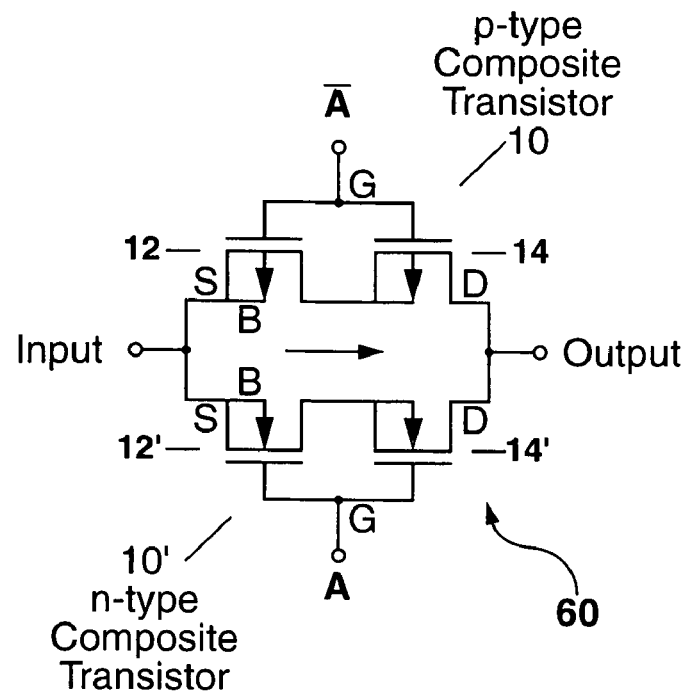
FIG. 5A shows a schematic diagram of an example of a body-tied one-way transmission gate formed using the p-type and n-type composite transistors of the present invention.
Figure 5B:
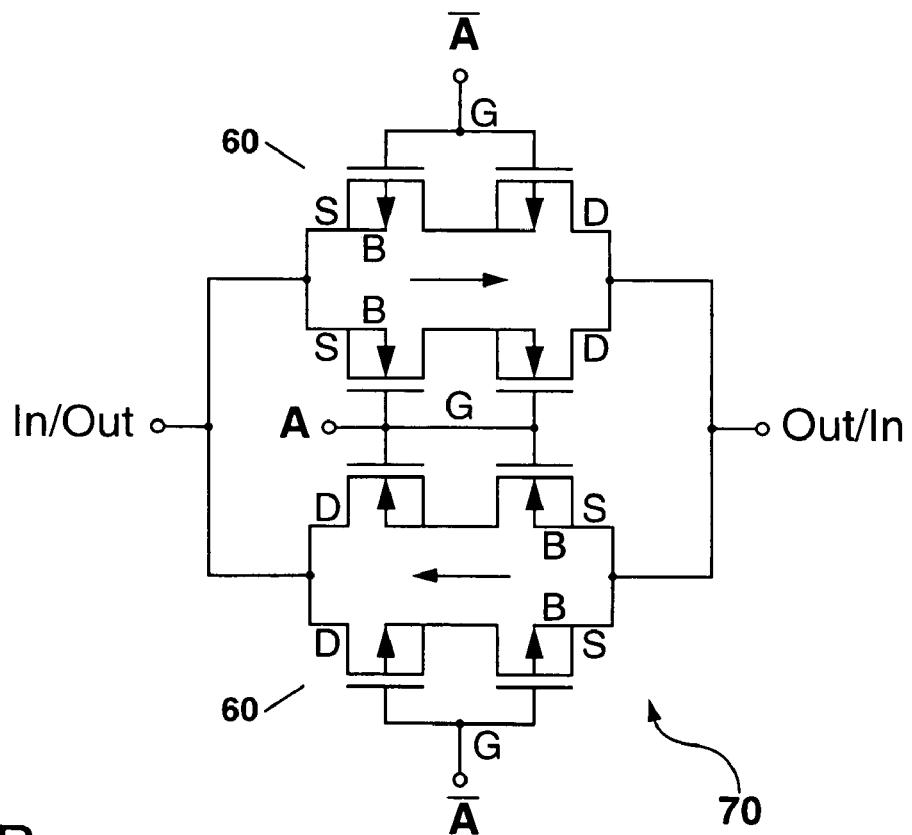
FIG. 5B shows a schematic diagram of an example of a body-tied two-way transmission gate formed using the p-type and n-type composite transistors of the present invention.

That the present invention is also applicable to protect transmission gates against SETs can be seen from the examples of FIGS. 5A and 5B. FIG. 5A shows a body-tied one-way transmission gate 60 formed according to the present invention; and FIG. 5B shows a body-tied two-way transmission gate 70 formed according to the present invention.

In FIG. 5A, the body-tied one-way transmission gate 60 is formed by connecting the source terminals S of a p-type composite transistor 10 and an n-type composite transistor 10' together to form an input for the transmission gate 60; and by connecting the drain terminals D of the composite transistors 10 and 10' together to form an output for the transmission gate 60. The body B of each composite transistor 10 and 10' is tied to the source S thereof so that the input signal will provide a well-defined reference voltage for each body B.

The body-tied one-way transmission gate 60 in FIG. 5A is enabled to transmit a signal provided to the input in the direction indicated by the horizontal arrow when complementary control signals $\overline{A}$ and A are applied to the gates G of the composite transistors 10 and 10'. The complementary control signals $\overline{A}$ and A allow each composite transistor 10 and 10' to be turned "ON" or "OFF" together. When the transistors 10 and 10' are both "OFF", the input signal is blocked. When the transistors 10 and 10' are both "ON", the input signal is transmitted to the output, with "HIGH" or positive values of the input signal being transmitted through the p-type composite transistor 10 to the output, and with "LOW" or negative values of the input signal being transmitted through the n-type composite transistor 10' to the output.

To form a body-tied two-way transmission gate 70, two body-tied one-way transmission gates 60 can be connected together in opposite directions as shown in FIG. 5B. In FIG. 5B, an upper transmission gate 60 transmits a signal provided at an input/output terminal (labelled "In/Out") to an output/input terminal (labelled "Out/In"). The direction of transmission of this signal is indicated by the right-facing arrow in FIG. 5B. The other transmission gate 60 at the bottom of FIG. 5B acts to transmit a signal provided at the output/input terminal to the input/output terminal as indicated by the left-facing arrow. This arrangement allows the input in each direction to provide a well-defined voltage reference source for the body B of each composite transistor 10 and 10'. The signals transmitted through the transmission gates 60 and 70 in FIGS. 5A and 5B can be either analog or digital signals.

Figure 5C:
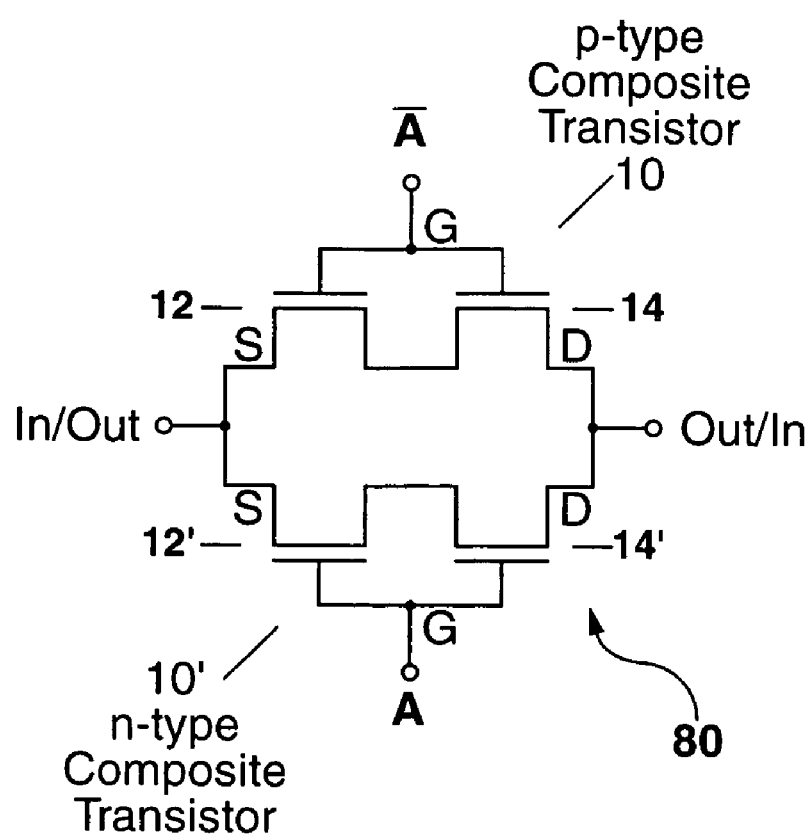
FIG. 5C shows a schematic diagram of another example of a two-way transmission gate formed using the p-type and n-type composite transistors without any body ties.

FIG. 5C shows another example of a two-way transmission gate 80 which can be formed on a silicon-on-insulator (SOI) substrate without any body ties. This example of the present invention can be formed similarly to that of FIG. 5A, with the body terminals of each transistor being left unconnected or omitted entirely. Since the body ties are not used, signals can flow through the transmission gate 80 in FIG. 5C in both directions, with the "HIGH" or positive values of the signals being conducted through the composite transistor 10, and with the "LOW" or negative values of the signals being conducted through the composite transistor 10'.

The two-way transmission gate 80 in the example of FIG. 5C can be used by itself to form a CMOS IC 90. Alternately, the two-way transmission gate 80 of FIG. 5C can be used in a CMOS IC 90 wherein each and every n-type and p-type MOS transistor is a composite transistor 10 or 10' in which the body terminals are left unconnected or omitted entirely. Such a CMOS IC 90 can be formed on a silicon-on-insulator substrate or on a bulk semiconductor substrate as will be described hereinafter.

The transmission gates 60, 70 and 80 in the examples of FIGS. 5A, 5B and 5C are radiation-hardened against SETs in a manner similar to that previously described for the inverter circuit 50. Each composite transistor 10 and 10' includes a circuit transistor 12 or 12' and a blocking transistor 14 or 14', with the blocking transistor 14 or 14' preventing any SET in the circuit transistor 12 or 12' from being propagated to the output of the transmission gate; and with the circuit transistor 12 or 12' similarly preventing any SET in the blocking transistor 14 or 14' from propagating to the output of the transmission gate.

The radiation-hardened p-type and n-type composite transistors 10 and 10' of the present invention can be fabricated on a silicon-on-insulator (SOI) substrate, or on a bulk semiconductor substrate (e.g. comprising silicon or germanium) to form a CMOS IC. In either case, it is necessary to provide a body for each circuit transistor and each blocking transistor which is electrically isolated from the substrate. This ensures that there is no substrate current path for the transient current $I_{SET}$ between adjacent transistors or to the substrate that would allow the transient current $I_{SET}$ to perturb the output of a CMOS IC in which the composite transistors 10 and 10' are used. The isolated body for each circuit and blocking transistor also ensures that generated electrons and holes from a SET occurring in the SOI or bulk substrate will not be reach one or more of the transistors 12, 12', 14 and 14'.

Figure 6A:
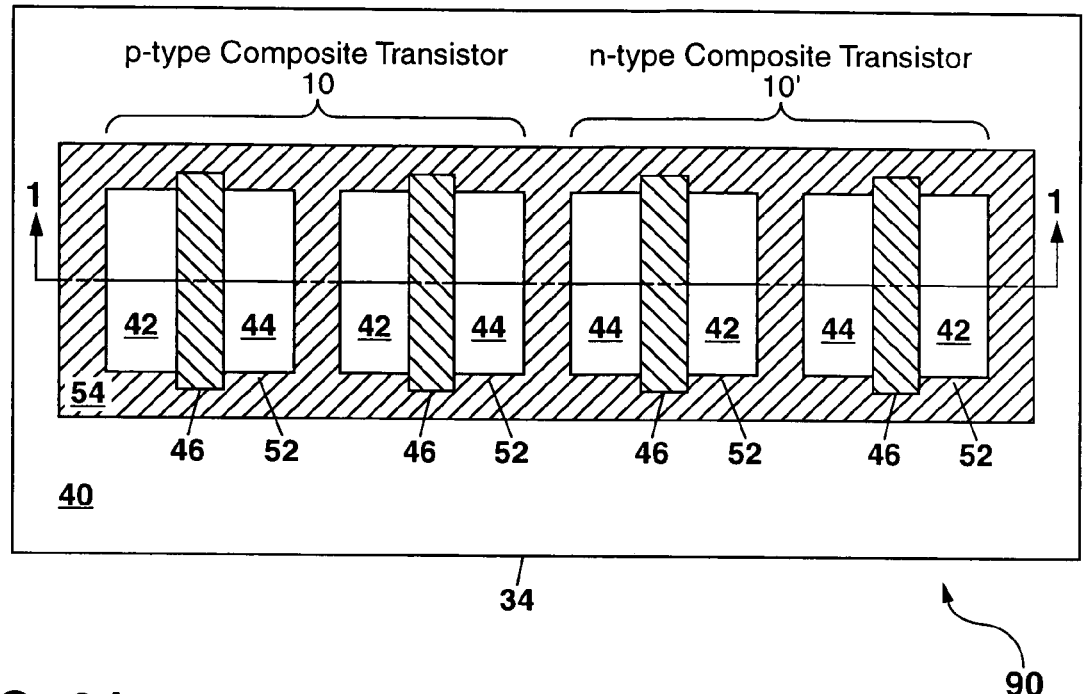
FIG. 6A shows a schematic plan view of a portion of a CMOS IC fabricated on a silicon-on-insulator (SOI) substrate using the p-type and n-type composite transistors of the present invention. The circuit and blocking transistors for each composite transistors are formed in separate islands. The wiring interconnecting the various transistors has been omitted for clarity.
Figure 6B:
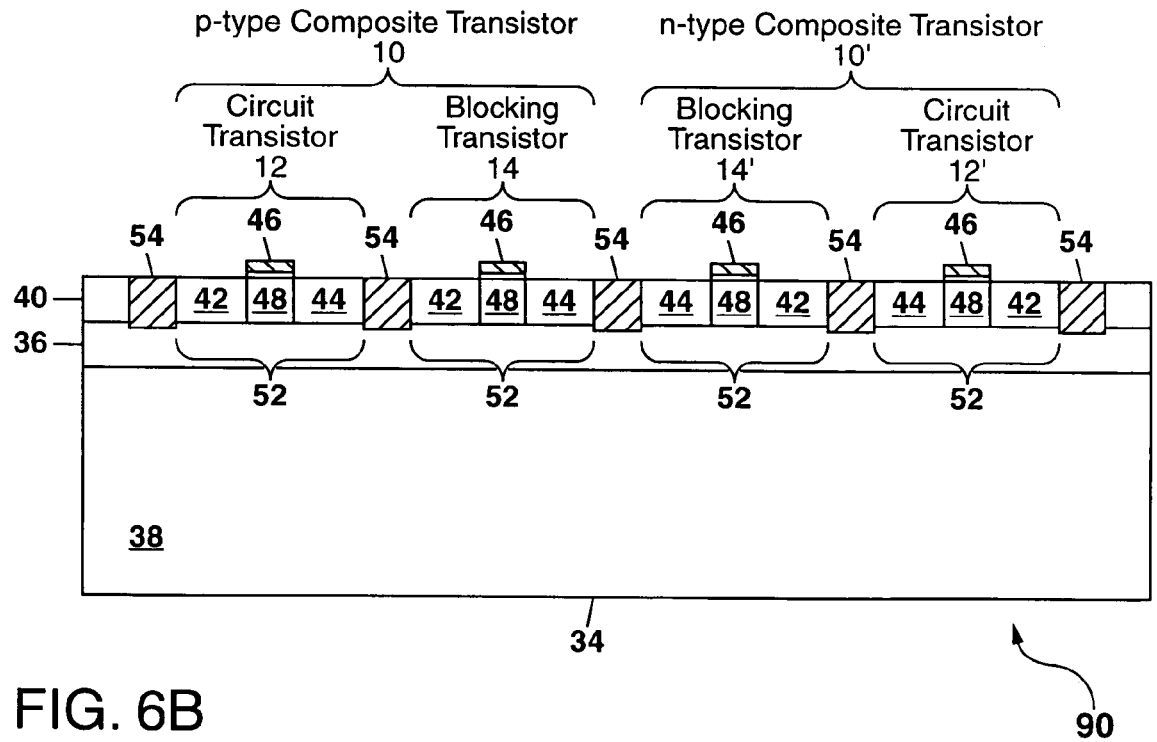
FIG. 6B shows a schematic cross-section view of the device of FIG. 6A along the section-line 1-1 in FIG. 6A.

FIGS. 6A and 6B show a plan view and a cross-section view, respectively, of a portion of a CMOS IC 90 to illustrate fabrication of the p-type and n-type composite transistors 10 and 10' on a SOI substrate 34 with the circuit transistors 12 and 12' and the blocking transistors 14 and 14' each being formed in a separate island 52 to provide electrical isolation for the bodies 48 of each transistor. The transistors 10 and 10' can be interconnected with one or more levels of interconnect wiring (not shown) to form the inverter circuit 50 of FIG. 3, the transmission gate 60 of FIG. 5A, or any type of CMOS IC known to the art. Such a CMOS IC can contain up to hundred of thousands or more of individual logic elements and memory elements formed according to the teachings of the present invention using the n-type and p-type composite transistors 10 and 10'.

The SOI substrate 34 in FIGS. 6A and 6B comprises a buried oxide layer 36 sandwiched between a monocrystalline silicon body 38 and a monocrystalline silicon layer 40. Each circuit transistor 12 and 12' and each blocking transistor 14 and 14' can be fabricated in the monocrystalline silicon layer 40 using a series of well-known semiconductor IC processing steps which define a source 42, a drain 44, a gate 46 and a body 48 for each transistor. The body 48 for each transistor can be tied (i.e. electrically connected) to the source 42 thereof during fabrication of the transistors 12, 12', 14 and 14'. This can be done, for example, by extending the body 48 of each transistor beneath the source 42 thereof and using an ion implantation step to form a heavily p- or n-doped region on a side of the source 42 opposite the body 48 as described in U.S. Pat. No. 6,268,630 which is incorporated herein by reference. This p- or n-doped region electrically connects the source 42 to the body 48 thereby forming the transistors 12, 12', 14 and 14' as body-tied transistors.

In other embodiments of the present invention, certain of the transistors 12, 12', 14 and 14' in some of the composite transistors 10 and 10' can be formed as body-tied transistors on the SOI substrate 34 while the transistors in other composite transistors 10 and 10' in the CMOS IC 90 can be left untied (i.e. with the transistor body 48 not being electrically connected to the source 42 thereof). In yet other embodiments of the present invention, every transistor in the CMOS IC 90 formed on a SOI substrate 34 will be a composite transistor 10 or 10', with the transistors 12 and 14 or 12' and 14' being untied. Generally providing each transistor 12, 12', 14 and 14' as a body-tied transistor is to be desired since there can be undesirable effects due to threshold voltage level variations and other radiation susceptibilities when the bodies of these transistors are left untied.

During fabrication of each transistor 12, 14, 12' and 14' in FIGS. 6A and 6B, a trench can be etched down through the monocrystalline silicon layer 40 about each transistor being formed to define the island 52 in the monocrystalline silicon layer 40. A field oxide 54 (e.g. comprising silicon dioxide or a silicate glass such as TEOS deposited from the decomposition of tetraethylortho silicate) can then be deposited to fill in the trench and surround each island 52, thereby separating and electrically isolating the body 48 of each transistor 12, 14, 12' and 14' from the body of an adjacent transistor in the CMOS IC 90. Since the body 48 of each transistor 12, 14, 12' and 14' is electrically isolated in its own island 52 by the surrounding field oxide 54 and also by the underlying buried oxide layer 36 there can be no substrate current path for a transient current $I_{SET}$ to reach any other transistor in the CMOS IC 90. The substrate isolation of the body 48 of each circuit transistor 12 or 12' from the blocking transistor 14 or 14' in each composite transistor 10 and 10' is essential in order to ensure that the composite transistors 10 and 10' are radiation-hardened against SETs.

Figure 7A:
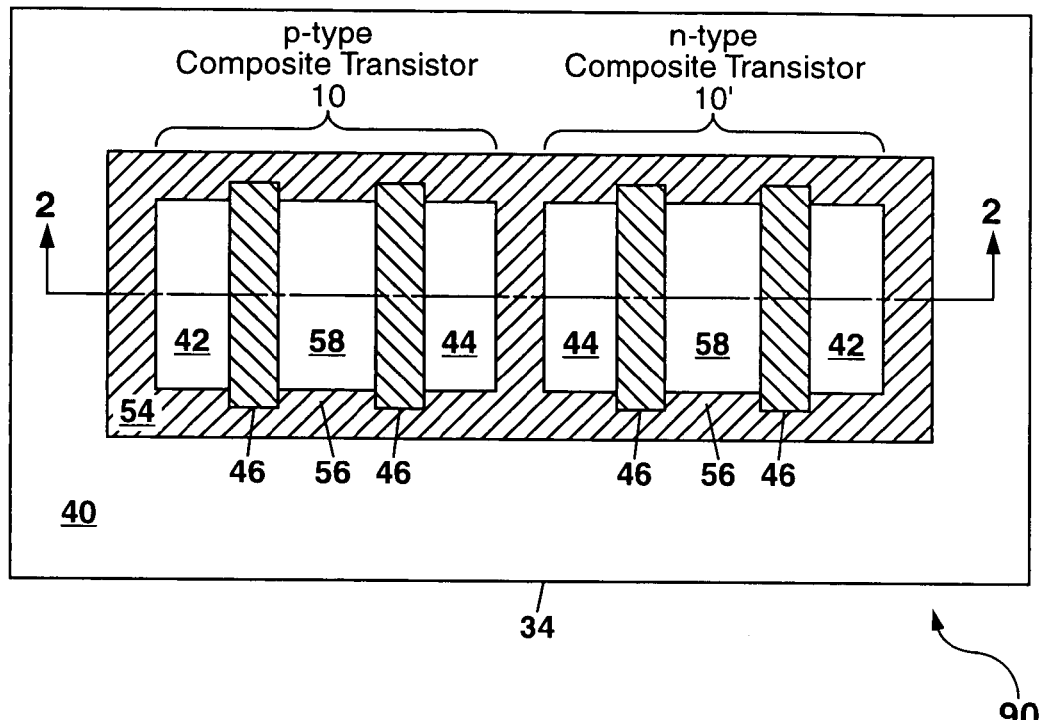
FIG. 7A shows a schematic plan view of a portion of a CMOS IC fabricated on a SOI substrate, with the circuit and blocking transistors of each composite transistor being formed in a common island. The wiring to each transistor has been omitted for clarity.
Figure 7B:
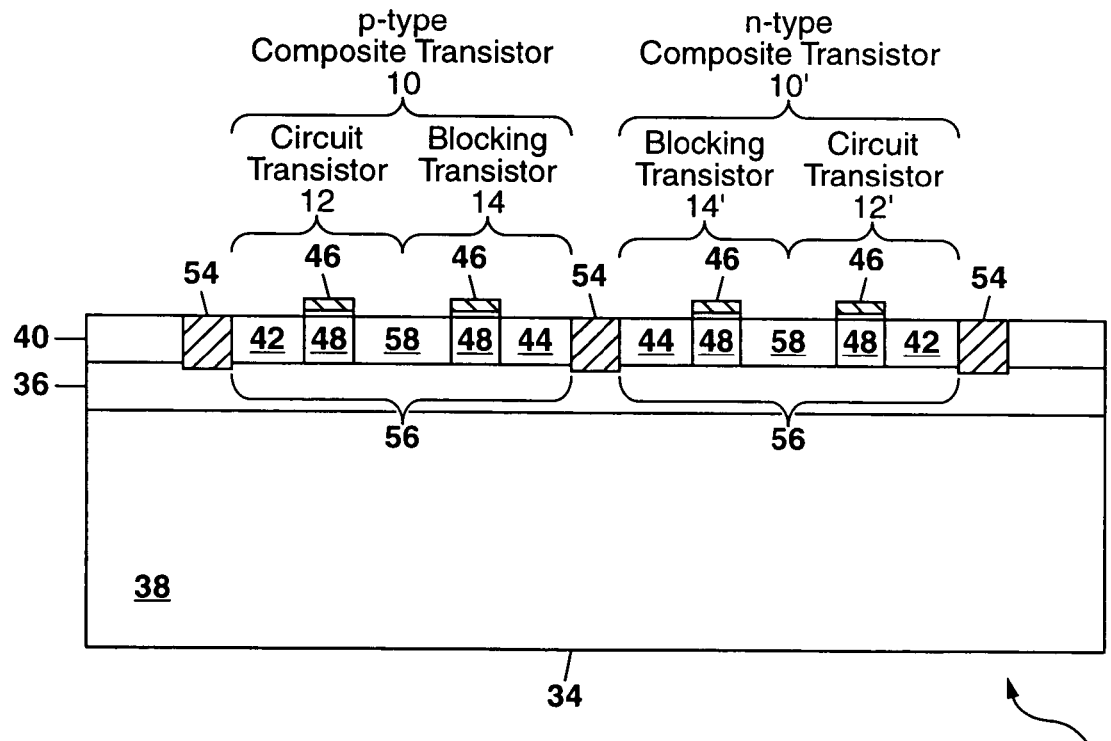
FIG. 7B shows a schematic cross-section view of the device of FIG. 7A along the section line 2-2 in FIG. 7A.

FIGS. 7A and 7B show schematic plan and cross-section views to illustrate another way of forming the CMOS IC 90 on a SOI substrate 34. In this case, the circuit transistor 12 or 12' and the blocking transistor 14 or 14' of each composite transistor 10 or 10' are formed in a common island 56 defined in the monocrystalline silicon layer 40. This is advantageous to save space on the SOI substrate 34, and also to provide a direct electrical connection between the source terminal of each blocking transistor 14 or 14' and the drain terminal of an adjacent circuit transistor 12 or 12'. For each composite transistor 10 or 10', a common drain/source region 58 is used in FIGS. 7A and 7B to form the source for the blocking transistor 14 or 14' and the drain for the circuit transistor 12 or 12'. Isolation of the body of the circuit transistor 12 or 12' from the blocking transistor 14 or 14' can be provided by extending the common drain/source region 58 completely across the common island 56 as shown in FIG. 7A.

The composite transistors 10 and 10' of the present invention can also be used to fabricate the CMOS IC 90 on a bulk semiconductor substrate 62 which comprises silicon or germanium. This is schematically illustrated in the cross-section view of FIG. 8A for a p-type-doped bulk semiconductor substrate 62, and in FIG. 8B for an n-type-doped bulk semiconductor substrate 62. Each circuit transistor 12, 12' and each blocking transistor 14, 14' is preferably formed as a body-tied transistor (i.e. with the body terminal being connected to the source terminal of that transistor) when a bulk semiconductor substrate is used. The term "bulk semiconductor substrate" as used herein refers to a semiconductor wafer comprising a monocrystalline semiconductor material (e.g. monocrystalline silicon), and is intended to include an epitaxially-grown semiconductor layer of the same semiconductor type as the remainder of the wafer.

Figure 8A:
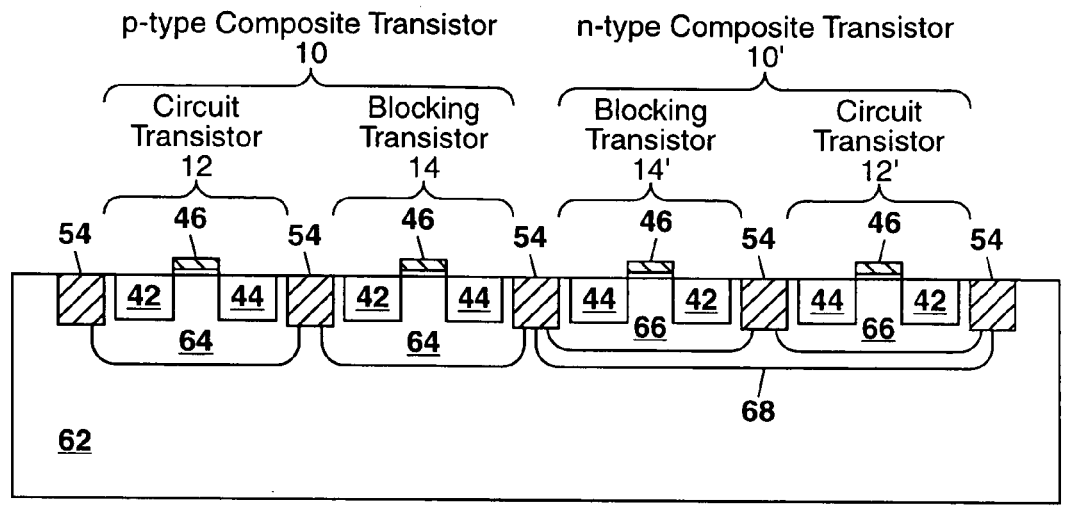
FIG. 8A shows a schematic cross-section view of a portion of a CMOS IC fabricated on a p-type-doped bulk semiconductor substrate according to the present invention.

When the bulk semiconductor substrate 62 is p-type-doped (e.g. by ion implanting or thermally diffusing a p-type dopant such as boron), the source 42 and drain 44 of each p-type circuit transistor 12 and each p-type blocking transistor 14 are formed in a separate n-type-doped well 64 (e.g. doped n-type with ion implanted or thermally diffused phosphorous) as shown in FIG. 8A. The n-type-doped wells 64 electrically isolate the p-type circuit and blocking transistors 12 and 14 from the p-type-doped substrate 62 by forming a reverse-biased semiconductor p-n junction at the interface of the n-type-doped well 64, which forms the body of each transistor 12 and 14, and the p-type-doped substrate 62. The n-type-doped wells 64 also serve to electrically isolate the bodies of the circuit and blocking transistors 12 and 14 from each other and from any other transistors, resistors, capacitors, etc., in the CMOS IC.

In FIG. 8A, each n-type circuit transistor 12' and each n-type blocking transistor 14' is also formed in a separate p-type-doped well 66 (e.g. doped p-type with boron). However, since the p-type-doped wells 66 are of the same polarity as the p-type-doped substrate 62, the p-type-doped wells 66 are electrically connected to the p-type-doped substrate 62. To remedy this situation and provide electrical isolation to prevent any transient current $I_{SET}$ produced in the drain-body junction 32 of the n-type transistors 12' and 14' from being conducted through the substrate 62, the p-type-doped wells 66 are located inside another n-type-doped well 68 as shown in FIG. 8A. The n-type-doped well 68 can then be electrically connected to $V_{dd}$ to provide a reverse-biased semiconductor p-n junction between the body of each transistor 12' and 14' and the n-type-doped well 68. Another reverse-biased semiconductor p-n junction is also formed between the n-type-doped well 68 and the p-type-doped substrate 62. These reverse-biased semiconductor p-n junctions block any electrical conduction between the bodies of the transistors 12' and 14' and also between the bodies 12' and 14' and the substrate 62. Additionally, the bodies of the n-type circuit and blocking transistors 12' and 14' are electrically isolated by the n-type-doped well 68 from any other transistors, resistors, capacitors etc., in the CMOS IC 90.

Figure 8B:
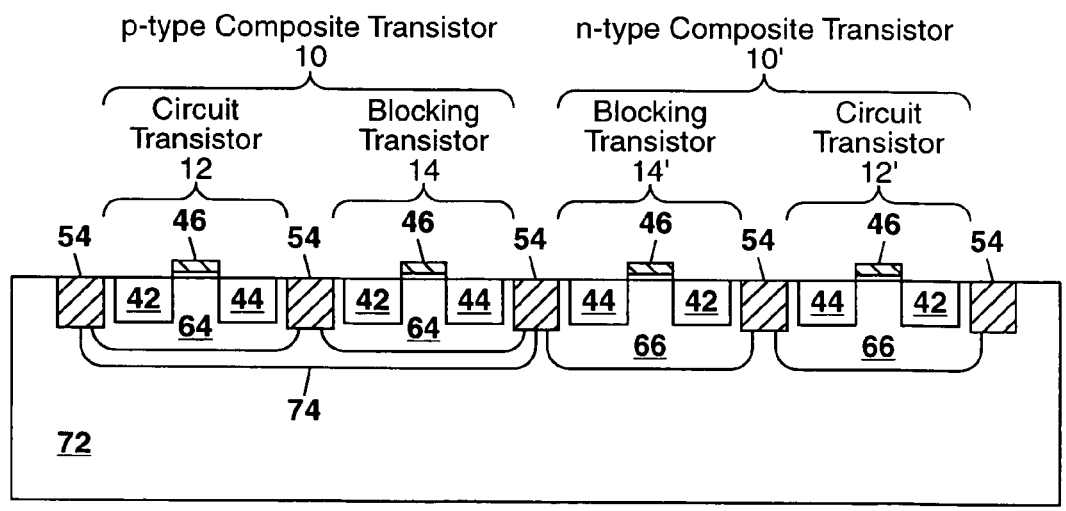
FIG. 8B shows a schematic cross-section view of a portion of a CMOS IC fabricated on an n-type-doped bulk semiconductor substrate according to the present invention.

FIG. 8B shows how the CMOS IC 90 can be fabricated on an n-type-doped semiconductor substrate 72. In this case, p-type-doped wells 66 are provided for each n-type circuit transistor 12' and n-type blocking transistor 14', with the bodies of these transistors being formed from the p-type-doped wells 66. The p-type-doped wells 66 can be formed, for example, by ion implanting boron into the n-type-doped substrate 72. The sources 42 and drains 44 of the transistors 12' and 14' can then be formed by ion implanting an n-type-dopant (e.g. phosphorous) into the wells 66.

The p-type circuit and blocking transistors 12 and 14 are formed in n-type-doped wells 64 which are further located within another p-type-doped well 74 which can be electrically connected to $V_{ss}$ to form a reverse-biased semiconductor p-n junction between the body of each transistor 12 and 14, which is formed from one of the n-type-doped wells 64, and the p-type-doped well 74. Another reverse-biased semiconductor p-n junction is formed between the p-type-doped well 74 and the n-type-doped substrate 72. This electrically isolates the bodies of the p-type transistors 12 and 14 from each other and from the substrate 72 and eliminates any substrate conduction path for the transient current $I_{SET}$. In FIG. 8B, the source 42 and drain 44 for each p-type transistor 12 and 14 comprises a region of p-type-doped semiconductor material which can be formed, for example, by ion implanting boron so that each source 42 and drain 44 is p-type doped to a concentration level higher than that of the substrate 72 and also higher than that of the wells 64 and 74.

Although FIGS. 6-8 show each composite transistor 10 and 10' being formed with the circuit and blocking transistors located adjacent to each other, this is not necessary. In some embodiments of the present invention, the circuit and blocking transistors for each composite transistor 10 and 10' can be spatially separated by an intervening circuit or blocking transistor from another composite transistor 10 or 10'. This can be advantageous to reduce the possibility for both the circuit transistor and the blocking transistor in a composite transistor 10 or 10' from being affected by the impact of an energetic particle at a shallow angle of incidence (i.e. an energetic particle which passes through both transistors and produces a transient voltage $V_{SET}$ and current $I_{SET}$ therein).

Figure 9A:
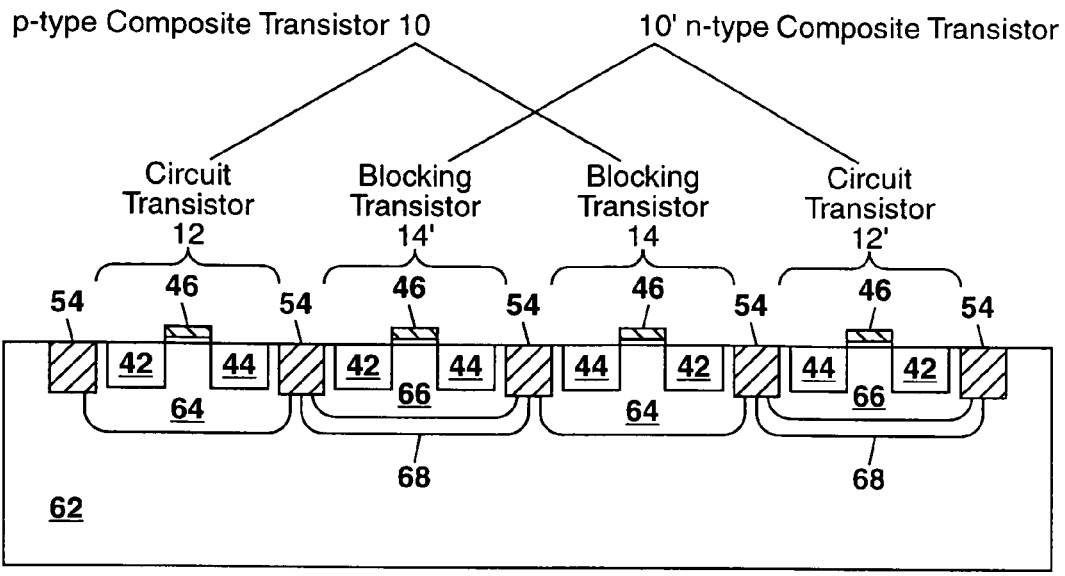
FIG. 9A shows a schematic cross-section view of a portion of a CMOS IC fabricated on a p-type-doped bulk semiconductor substrate with the p-type and n-type composite transistors being interlaced.
Figure 9B:
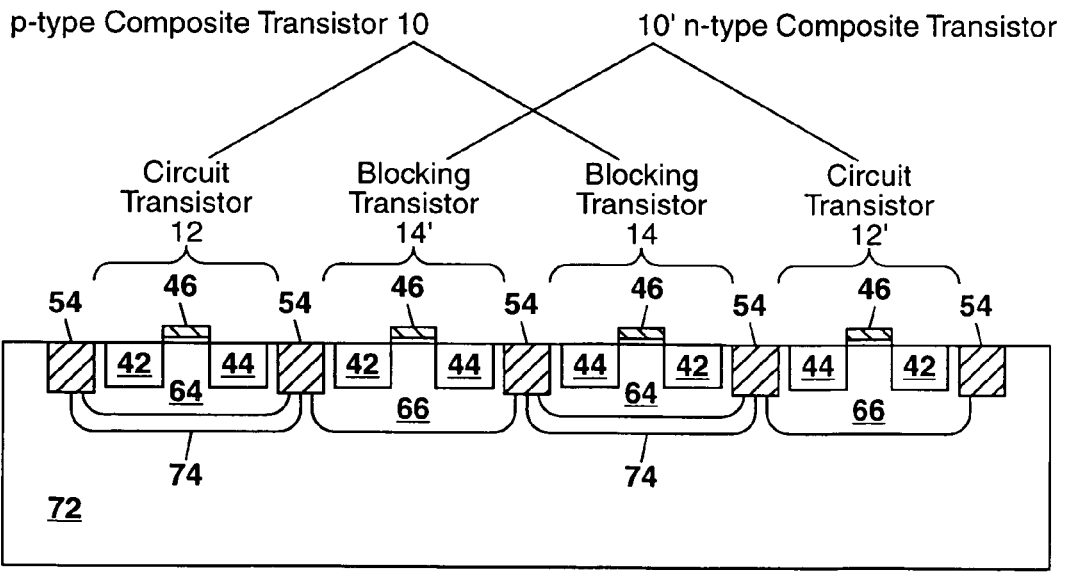
FIG. 9B shows a schematic cross-section view of a portion of a CMOS IC fabricated on an n-type-doped bulk semiconductor substrate with the p-type and n-type composite transistors being interlaced.

FIG. 9A shows an example of a CMOS IC 90 fabricated on a bulk p-type-doped semiconductor substrate 62 where the p-type and n-type composite transistors 10 and 10' have been interlaced. In this arrangement, each n-type circuit and blocking transistor 12' and 14' is located in its own n-type-doped well 68 so that the p-type well 66, which forms the body of that transistor, is electrically isolated from the p-type-doped substrate 62. Fabrication of a CMOS IC 90 on a bulk n-type doped semiconductor substrate 72 can be performed similarly as shown in FIG. 9B with each p-type circuit and blocking transistor 12 and 14 being located in its own p-type-doped well 74 to provide electrical isolation for the n-type body 64 of that transistor 12 or 14. Each composite transistor 10 and 10' can be similarly interlaced on an SOI substrate when each circuit and blocking transistor 12, 12', 14 and 14' is formed in a separate island 52 as shown in the example of FIGS. 6A and 6B.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A composite transistor for use in radiation hardening a complementary metal-oxide semiconductor (CMOS) integrated circuit, comprising:
a circuit transistor of an n-type or p-type having a source terminal, a drain terminal, a gate terminal and a body terminal; and
a blocking transistor of the same n-type or p-type having a source terminal, a drain terminal, a gate terminal and a body terminal, with the gate terminals of the circuit and blocking transistors being connected together to form a gate terminal for the composite transistor, with the source terminal of the circuit transistor forming a source terminal for the composite transistor, with the drain terminal of the blocking transistor forming a drain terminal for the composite transistor, with the source terminal of the blocking transistor being connected to the drain terminal of the circuit transistor, with the body terminal of the circuit transistor forming a body terminal for the composite transistor, and with the body terminal of the blocking transistor being connected to the source terminal of the blocking transistor and with the body terminal of the blocking transistor being electrically isolated from any other connection point in the CMOS integrated circuit.

2. The composite transistor of claim 1 further comprising a silicon-on-insulator (SOI) substrate wherein the circuit and blocking transistors are formed, with the SOI substrate having a buried oxide layer sandwiched between a monocrystalline silicon body and a monocrystalline silicon layer, and with the circuit transistor and the blocking transistor being formed within a common island defined within the monocrystalline silicon layer with the island being surrounded by a field oxide for electrical isolation, and with a body of the circuit transistor being separated and electrically isolated from a body of the blocking transistor by a common drain/source region which forms a drain for the circuit transistor and a source for the blocking transistor.

3. The composite transistor of claim 1 further comprising a silicon-on-insulator (SOI) substrate wherein the circuit and blocking transistors are formed, with the SOI substrate having a buried oxide layer sandwiched between a monocrystalline silicon body and a monocrystalline silicon layer, with the circuit transistor and the blocking transistor being formed in separate islands defined within the monocrystalline silicon layer, with each island being surrounded by a field oxide for electrical isolation.

4. The composite transistor of claim 1 further comprising a bulk semiconductor substrate wherein the circuit transistor and the blocking transistor are formed.

5. The composite transistor of claim 4 wherein the bulk semiconductor substrate comprises silicon.

6. The composite transistor of claim 4 wherein the bulk semiconductor substrate comprises a p-type-doped substrate having a separate n-type-doped well wherein each p-type composite transistor is formed, and further having a separate p-type-doped well wherein each n-type composite transistor is formed, with each p-type doped well being located within another n-type-doped well to electrically isolate each p-type-doped well from the p-type-doped substrate.

7. The composite transistor of claim 4 wherein the bulk semiconductor substrate comprises an n-type-doped substrate having a separate p-type-doped well wherein each n-type composite transistor is formed, and further having a separate n-type-doped well wherein each p-type composite transistor is formed, with each n-type-doped well being located within another p-type-doped well to electrically isolate each n-type-doped well from the n-type-doped substrate.

8. A radiation-hardened CMOS integrated circuit, comprising:
a semiconductor substrate; and
a plurality of interconnected n-type and p-type composite transistors formed on the semiconductor substrate, with each n-type and p-type composite transistor further comprising a circuit transistor and a blocking transistor of the same n-type or p-type, with the circuit and blocking transistor each having a source terminal, a drain terminal, a gate terminal, and a body terminal, and with the gate terminals of the circuit and blocking transistors being connected together to form a gate terminal for the composite transistor, with the source terminal of the circuit transistor forming a source terminal for the composite transistor, with the drain terminal of the blocking transistor forming a drain terminal for the composite transistor, with the source terminal of the blocking transistor being connected to the drain terminal of the circuit transistor, with the body terminal of the circuit transistor forming a body terminal for the composite transistor, and with the body terminal of the blocking transistor being connected to the source terminal of the blocking transistor and with the body terminal of the blocking transistor being electrically isolated from any other connection point in the CMOS integrated circuit.

9. The radiation-hardened CMOS integrated circuit of claim 8 wherein the semiconductor substrate comprises a silicon-on-insulator (SOI) substrate.

10. A radiation-hardened CMOS integrated circuit comprising:
   a bulk silicon substrate; and
   a plurality of interconnected n-type and n-type composite transistors formed on the bulk silicon substrate, with each n-type and p-type composite transistor further comprising a circuit transistor and a blocking transistor of the same n-type or n-type, with the circuit and blocking transistor each having a source terminal, a drain terminal, a gate terminal, and a body terminal, and with the gate terminals of the circuit and blocking transistors being connected together to form a gate terminal for the composite transistor, with the source terminal of the circuit transistor forming a source terminal for the composite transistor, with the drain terminal of the blocking transistor forming a drain terminal for the composite transistor, with the source terminal of the blocking transistor being connected to the drain terminal of the circuit transistor with the body terminal of the circuit transistor forming a body terminal for the composite transistor, and with the body terminal of the blocking transistor being connected to the source terminal of the blocking transistor and with the body terminal of the blocking transistor being electrically isolated from any other connection point in the CMOS integrated circuit and with a body of each blocking transistor forming a part of a reverse-biased semiconductor p-n junction to electrically isolate the body of that blocking transistor from the bulk silicon substrate, and from every other circuit transistor and blocking transistor in the radiation-hardened CMOS integrated circuit.

11. A radiation-hardened CMOS integrated circuit, comprising:
   a first p-channel transistor having a source terminal, a drain terminal, a gate terminal and a body terminal, with the body terminal of the first p-channel transistor being connected to the source terminal thereof;
   a second p-channel transistor having a source terminal, a drain terminal, a gate terminal and a body terminal, with the gate terminal of the second p-channel transistor being connected to the gate terminal of the first p-channel transistor, and with the source and body terminals of the second p-channel transistor being connected together and further being connected only to the drain terminal of the first p-channel transistor and to no other node in the radiation-hardened CMOS integrated circuit;
   a third n-channel transistor having a source terminal, a drain terminal, a gate terminal and a body terminal, with the body terminal of the third n-channel transistor being connected to the source terminal thereof; and
   a fourth n-channel transistor having a source terminal, a drain terminal, a gate terminal and a body terminal, with the gate terminal of the fourth n-channel transistor being connected to the gate terminal of the third n-channel transistor, and with the source and body terminals of the fourth n-channel transistor being connected together and further being connected only to the drain terminal of the third n-channel transistor and to no other node in the radiation-hardened CMOS integrated circuit.

12. The radiation-hardened CMOS integrated circuit of claim 11 wherein the source terminal of the first p-channel transistor is connected to a first reference potential, and the source terminal of the third n-channel transistor is connected to a second reference potential, and the gates of the first and second p-channel transistors are connected to the gates of the third and fourth n-channel transistors to provide an input connection for the radiation-hardened CMOS integrated circuit, and the drain terminals of the second p-channel transistor and the fourth n-channel transistor are connected together to provide an output connection for the radiation-hardened CMOS integrated circuit.

13. A radiation-hardened CMOS integrated circuit comprising:
   a first p-channel transistor having a source terminal, a drain terminal, a gate terminal and a body terminal, with the body terminal of the first p-channel transistor being connected to the source terminal thereof;
   a second p-channel transistor having a source terminal, a drain terminal, a gate terminal and a body terminal, with the gate terminal of the second p-channel transistor being connected to the gate terminal of the first p-channel transistor, and with the source and body terminals of the second p-channel transistor being connected together and further being connected only to the drain terminal of the first p-channel transistor and to no other node in the radiation-hardened CMOS integrated circuit;
   a third n-channel transistor having a source terminal, a drain terminal, a gate terminal and a body terminal, with the body terminal of the third n-channel transistor being connected to the source terminal thereof; and
   a fourth n-channel transistor having a source terminal, a drain terminal, a gate terminal and a body terminal, with the gate terminal of the fourth n-channel transistor being connected to the gate terminal of the third n-channel transistor, and with the source and body terminals of the fourth n-channel transistor being connected together and further being connected only to the drain terminal of the third n-channel transistor and to no other node in the radiation-hardened CMOS integrated circuit
   wherein the source terminal of the first p-channel transistor is connected to the source terminal of the third n-channel transistor to provide an input connection for the radiation-hardened CMOS integrated circuit, and the drain terminal of the second p-channel transistor is connected to the drain terminal of the fourth n-channel transistor to provide an output connection for the radiation-hardened CMOS integrated circuit.

14. A radiation-hardened CMOS integrated circuit, comprising:
   a semiconductor substrate,
   a plurality of interconnected n-type and p-type metal-oxide semiconductor (MOS) transistors on the semiconductor substrate, with every n-type and p-type MOS transistor in the radiation-hardened CMOS integrated circuit being a composite transistor which further comprises:

a circuit transistor of an n-type or p-type having a source terminal, a drain terminal, a gate terminal, and an unconnected or omitted body terminal; and a blocking transistor of the same n-type or p-type having a source terminal, a drain terminal a gate terminal, and an unconnected or omitted body terminal with the gate terminals of the circuit and blocking transistors being connected together to form a gate terminal for the composite transistor, with the source terminal of the circuit transistor forming a source terminal for the composite transistor, with the drain terminal of the blocking transistor forming a drain terminal for the composite transistor, and with the source terminal of the blocking transistor being connected to the drain terminal of the circuit transistor.

15. The radiation-hardened CMOS integrated circuit of claim 14 wherein the substrate comprises a silicon-on-insulator (SOI) substrate.

\* \* \* \* \*